(12) United States Patent
Kato

(10) Patent No.: US 7,352,031 B2
(45) Date of Patent: Apr. 1, 2008

(54) ELECTROSTATIC-BREAKDOWN-PREVENTIVE AND PROTECTIVE CIRCUIT FOR SEMICONDUCTOR-DEVICE

(75) Inventor: Katsuhiro Kato, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 786 days.

(21) Appl. No.: 10/407,463

(22) Filed: Apr. 7, 2003

(65) Prior Publication Data

US 2003/0223165 A1    Dec. 4, 2003

(30) Foreign Application Priority Data

May 28, 2002    (JP)    ............................. 2002-153503

(51) Int. Cl.
*H01L 23/62*    (2006.01)
(52) U.S. Cl. ...................... 257/355; 257/356; 257/360; 257/E29.122; 361/56
(58) Field of Classification Search ................ 257/203, 257/204, 206, 355–358, 360, E29.122; 361/56, 361/57
See application file for complete search history.

(56) References Cited

U.S. PATENT DOCUMENTS 6,004,838 A * 12/1999 Ma et al. ..................... 438/200
6,239,958 B1 * 5/2001 Kato et al. ..................... 361/56

FOREIGN PATENT DOCUMENTS

| JP | 60-014460 | 1/1985 |
| JP | 2028362 | 1/1990 |
| JP | 2-271673 | 11/1990 |
| JP | 3-74870 | 3/1991 |
| JP | 04-111350 | 4/1992 |
| JP | 4257256 | 9/1992 |
| JP | 10-125802 | 5/1998 |

* cited by examiner

*Primary Examiner*—Minhloan Tran
*Assistant Examiner*—Benjamin Tzu-Hung Liu
(74) *Attorney, Agent, or Firm*—Volentine & Whitt, P.L.L.C.

(57) ABSTRACT

A compact electrostatic-breakdown-preventive and protective circuit for a semiconductor-device capable of performing high-speed operations includes first and second protective transistors. The distance from a contact hole for connecting an impurity diffusion layer serving as a source and a drain of each of the first and second protective transistors with a metallic wiring, to gates of the protective transistors, is made shorter than a corresponding distance in an output transistor or a protective transistor provided for an input terminal.

4 Claims, 13 Drawing Sheets

ELECTROSTATIC-BREAKDOWN-PREVENTIVE AND PROTECTIVE CIRCUIT FOR SEMICONDUCTOR-DEVICE

BACKGROUND OF THE INVENTION

1. Field of the Invention

The present invention relates to an electrostatic-breakdown-preventive and protective circuit for a semiconductor-device separately provided with a dedicated power-source line and a dedicated ground line for driving an output transistor and a dedicated power-source line and a dedicated ground line for a logic circuit.

2. Description of the Related Art

In recent years, a semiconductor integrated circuit (may be hereinafter referred to as a semiconductor device or a device) uses a power-source line for driving an output transistor (hereinafter as output power-source line) and a power-source line for operating a logic circuit (hereinafter referred to as internal power-source line) by separating them from each other. This is because if they are used together, the voltage of the power-source line drops when the output transistor is turned on and a large current flows and the voltage drop is directly transmitted to the power-source line of the logic circuit and thereby, the logic circuit may not operate normally. In the case of this semiconductor device, ground lines are usually separated into a ground line for driving the output transistor (hereinafter referred to as output ground line) and a ground line for operating the logic circuit (hereinafter referred to as internal ground line). This type of device has a problem of an electrostatic breakdown easily occurring therein. The reason for this problem is described below by using an input/output terminal as an example.

FIG. 12 shows a conventional semiconductor-device electrostatic-breakdown-preventive and protective circuit (circuit diagram of an input/output terminal). A P-channel MOS (Metal-Oxide-Semiconductor, hereinafter referred to as PMOS) output transistor 102 is connected between an input/output line 101 and an output power-source line 110 and an N-channel MOS (Metal-Oxide-Semiconductor, hereinafter referred to as NMOS) output transistor 103 is connected between the input/output line 101 and an output ground line 120. The input/output line 101 is connected to gates of a PMOS transistor 105 and an NMOS transistor of an inverter 130 constituted by the PMOS 105 and NMOS 106 through a protective resistor 104. The source of the PMOS transistor 105 is connected to an internal power-source line 111 and the source of the NMOS 106 is connected to an internal ground line 121. The drain of the PMOS 105 and the drain of the NMOS 106 are shorted. In the case of the above input/output circuit, when an electrostatic surge is applied between the input/output line 101 and output power-source line 110, the PMOS output transistor 102 serves as a protective transistor. That is, because a surge current passes through the PMOS output transistor 102 serving as both an output transistor and a protective transistor, the gates (oxide films) of the PMOS transistor 105 and the NMOS transistor 106 of the inverter 130 are not easily broken down (hereinafter, PMOS output transistor is referred to as PMOS protective transistor 102). The protective resistor 104 prevents a surge voltage from being transitionally applied to the gates of the PMOS transistor 105 and the NMOS transistor 106 of the inverter 130 until the surge current completely passes through the PMOS protective transistor 102. Also when an electrostatic surge is applied between the input/output line 101 and the output ground line 120, gates of the PMOS transistor 105 and the NMOS transistor 106 of the inverter 130 are not broken down because a surge current passes through the NMOS output transistor 103. Because the NMOS output transistor 103 also serves as both an output transistor and a protective transistor, it is hereinafter referred to as an NMOS protective transistor 103.

However, when an electrostatic surge is applied between the input/output line 101 and the internal power-source line 111, the gate of the PMOS transistor 105 of the inverter is easily broken down because there is no route for passing a surge current. Similarly, when an electrostatic surge is applied between the input/output line 101 and internal ground line 121, the gate of the NMOS transistor 106 of the inverter 130 is broken down.

To solve the above problems, an improved protective transistor, shown in FIG. 13, is used. That is, a PMOS protective transistor 107 is provided between the output power-source line 110 and the internal power-source line 111 and an NMOS protective transistor 108 is provided between the output ground line 120 and the internal ground line 121. By providing the PMOS protective transistor 107, even if an electrostatic surge is applied between the input/output line 101 and the internal power-source line 111, a surge current passes through the PMOS transistor 102 and the PMOS transistor 107. Therefore, it is possible to prevent the gate of the PMOS transistor 105 of the inverter 130 from being broken down. Even if an electrostatic surge is applied between the input/output line 101 and internal ground line 121, because a surge current passes through the NMOS protective transistors 103 and 108, it is possible to prevent the gate of the NMOS transistor 106 of the inverter 130 from being broken down.

In the case of the above method, however, the area of a protective transistor is generally increased because it is necessary to secure response characteristics of the PMOS protective transistor 107 and the NMOS protective transistor 108 to an electrostatic surge. Moreover, in the case of this method, because a surge current passes through two devices such as the PMOS protective transistors 102 and 107 or the NMOS protective transistors 103 and 108, it is necessary to increase the resistance value of the protective resistor 104 so that a surge voltage is not applied to gates of the PMOS transistor 105 and the NMOS transistor 106 of the inverter 130 by the time the surge current completely passes between the two devices. Because increase of the PMOS protective transistor 107 and the NMOS protective transistor 108 in size causes the area occupied by a protective device to increase, there are disadvantages that the number of restrictions on a pattern layout increases and the chip cost is increased and increase of the resistance value of the protective resistor 104 is disadvantageous for high-speed operations.

SUMMARY OF THE INVENTION

The present invention provides the above improved compact electrostatic-breakdown-preventive and protective circuit for a semiconductor-device performing high-speed operations and capable of preventing the area of a protect device and the protective resistor value of a gate from increasing without changing a production process.

A first aspect of the invention provides an electrostatic-breakdown-preventive and protective circuit for a semiconductor-device comprising a first protective transistor between a first power-source line connected with an output transistor or a protective transistor disposed for an input terminal and a second power-source line connected with an inverter of an internal circuit; and a second protective transistor disposed between a first ground line connected with an output transistor or a protective transistor disposed for an input terminal and a second ground line connected with an inverter of an internal circuit, wherein the distance from a contact hole for connecting an impurity diffusion layer serving as the source and a drain of each of the first and second protective transistors with a metallic wiring to the gate of the transistors is smaller than the distance from a contact hole for connecting an impurity diffusion layer serving as the source and the drain of the output transistor or the protective transistor disposed for the input terminal with a metallic wiring to the gate of the transistors.

A second aspect of the invention provides an electrostatic-breakdown-preventive and protective circuit for a semiconductor-device comprising a first protective transistor provided between a first power-source line connected with an output transistor or a protective transistor disposed for an input terminal and a second power-source line an inverter of an internal circuit; and a second protective transistor disposed between a first ground line connected to an output transistor or a protective transistor disposed for an input terminal and a second ground line connected to an inverter of an internal circuit, wherein a compound layer of silicon and metal is formed on the entire surface between a contact hole for connecting an impurity diffusion layer serving as a source and a drain with a metallic wiring to a gate for the first and second protective transistors, and a region for forming no compound layer of silicon and metal is formed between a contact hole for connecting an impurity diffusion layer serving as a source and a drain with a metallic wiring and a gate in the output transistor or another protective transistor disposed for the input terminal.

In the electrostatic-breakdown-preventive and protective circuit for a semiconductor-device of the first or the second aspect, it is preferable that the distance from the contact hole for connecting the impurity diffusion layer serving as the source and the drain of each of the first and the second protective transistors with the metallic wiring has the minimum value in a fabrication process.

A third aspect of the invention provides an electrostatic-breakdown-preventive and protective circuit for a semiconductor-device comprising a first protective transistor between a first power-source line connected with an output transistor or a protective transistor disposed for input terminal and a second power-source line connected with an inverter of an internal circuit; and a second protective transistor disposed between a first ground line connected with an output transistor or a protective transistor disposed for an input terminal and a second ground line connected with an inverter of an internal circuit; and at least one of a first resistor whose one end is connected to the first power-source line in the vicinity of the output transistor or the protective transistor disposed for the input terminal and whose another end is connected to the second power-source line in the vicinity of the inverter of the internal circuit and a second resistor whose one end is connected to the first ground line in the vicinity of the output transistor or the protective transistor disposed for the input terminal and whose another end is connected to the second ground line in the vicinity of the inverter of the internal circuit.

A fourth aspect of the invention provides an electrostatic-breakdown-preventive and protective circuit for a semiconductor-device having a first resistor whose one end is connected between a first output transistor or a protective transistor disposed for an input terminal and a first power-source line connected with the first output transistor or the protective transistor provided for the input terminal and whose another end is connected between the inverter of an internal circuit and a second power-source line connected with the inverter of the internal circuit; and a second resistor whose one end is connected between a second output transistor or a protective transistor disposed for an input terminal and a first ground line connected with the second output transistor or the protective transistor disposed for the input terminal and whose another end is connected between the inverter of an internal circuit and a second ground line connected with the inverter of the internal circuit.

As described above, the invention makes it possible to provide a compact electrostatic-breakdown-preventive and protective circuit for a semiconductor-device capable of performing high-speed operations.

DESCRIPTION OF THE PREFERRED EMBODIMENTS

Embodiments of the present invention are described below by referring to the accompanying drawings. A component having substantially the same function is provided with the same reference symbol through all drawings and described but the description of the component may be omitted.

FIRST EMBODIMENT

Figure 1:
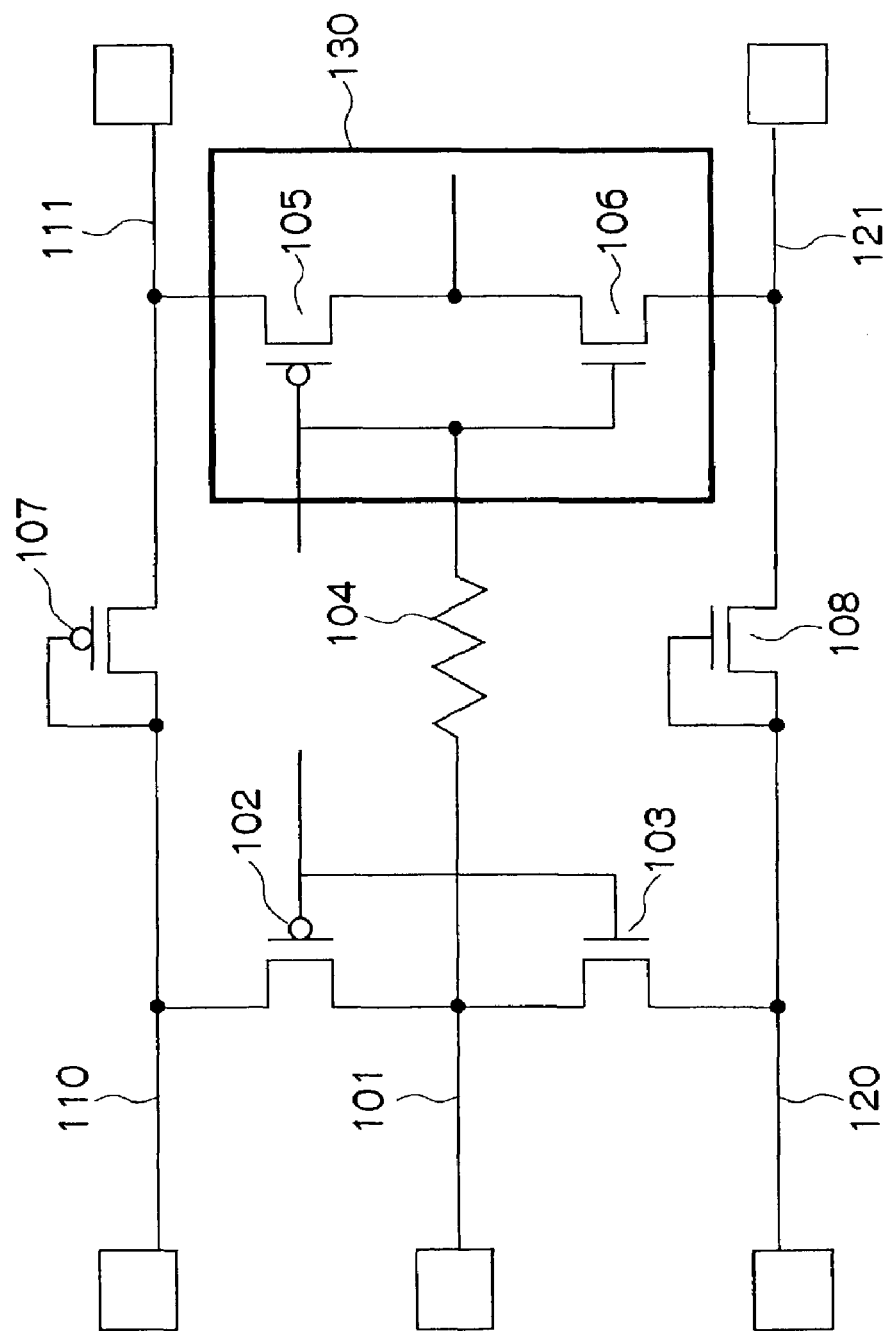
FIG. 1 is a circuit diagram showing an electrostatic-breakdown-preventive and protective circuit for a semiconductor-device of a first embodiment of the present invention.
Figure 2:
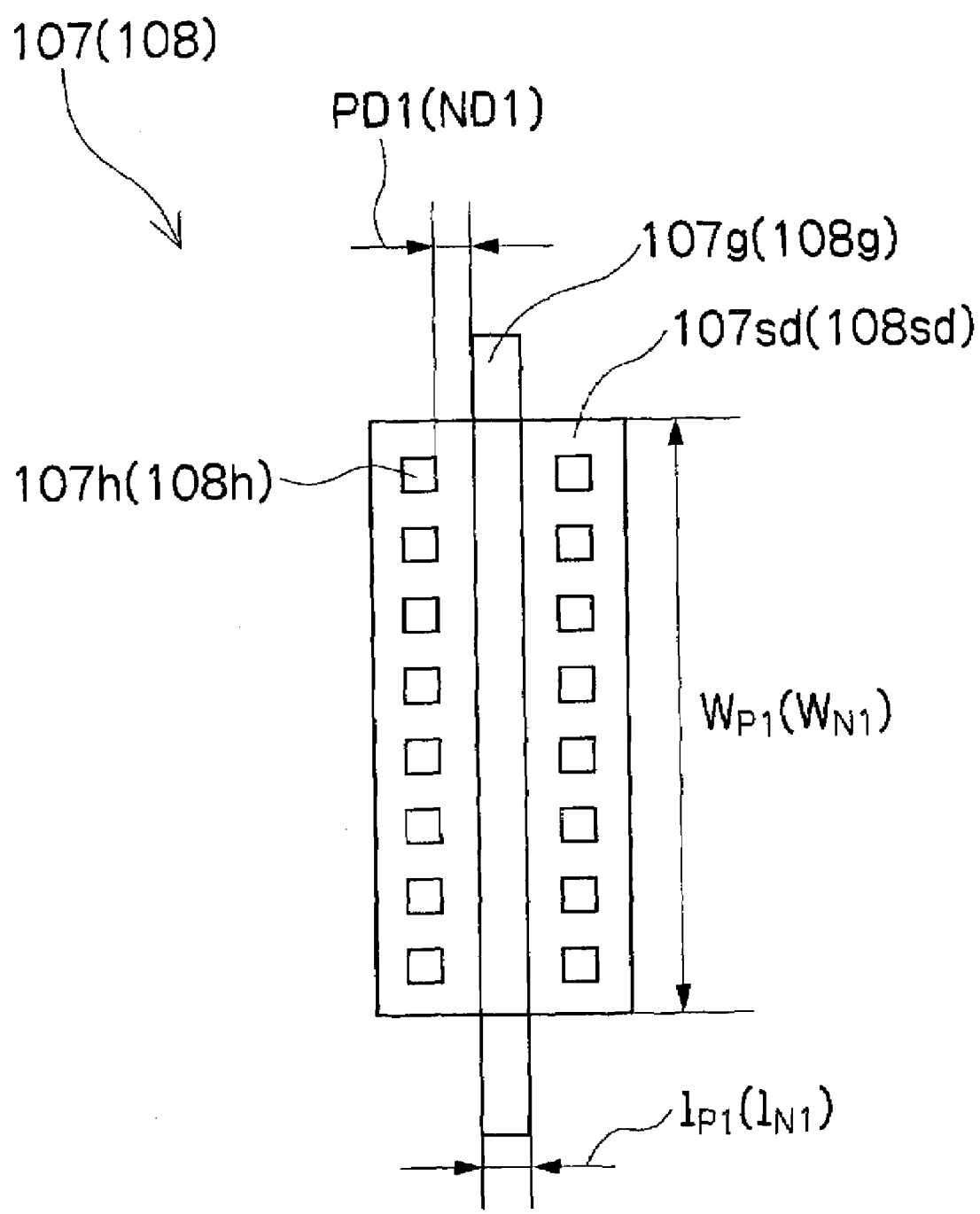
FIG. 2 is a top view showing a protective transistor of the electrostatic-breakdown-preventive and protective circuit for a semiconductor-device of the first embodiment.
Figure 3:
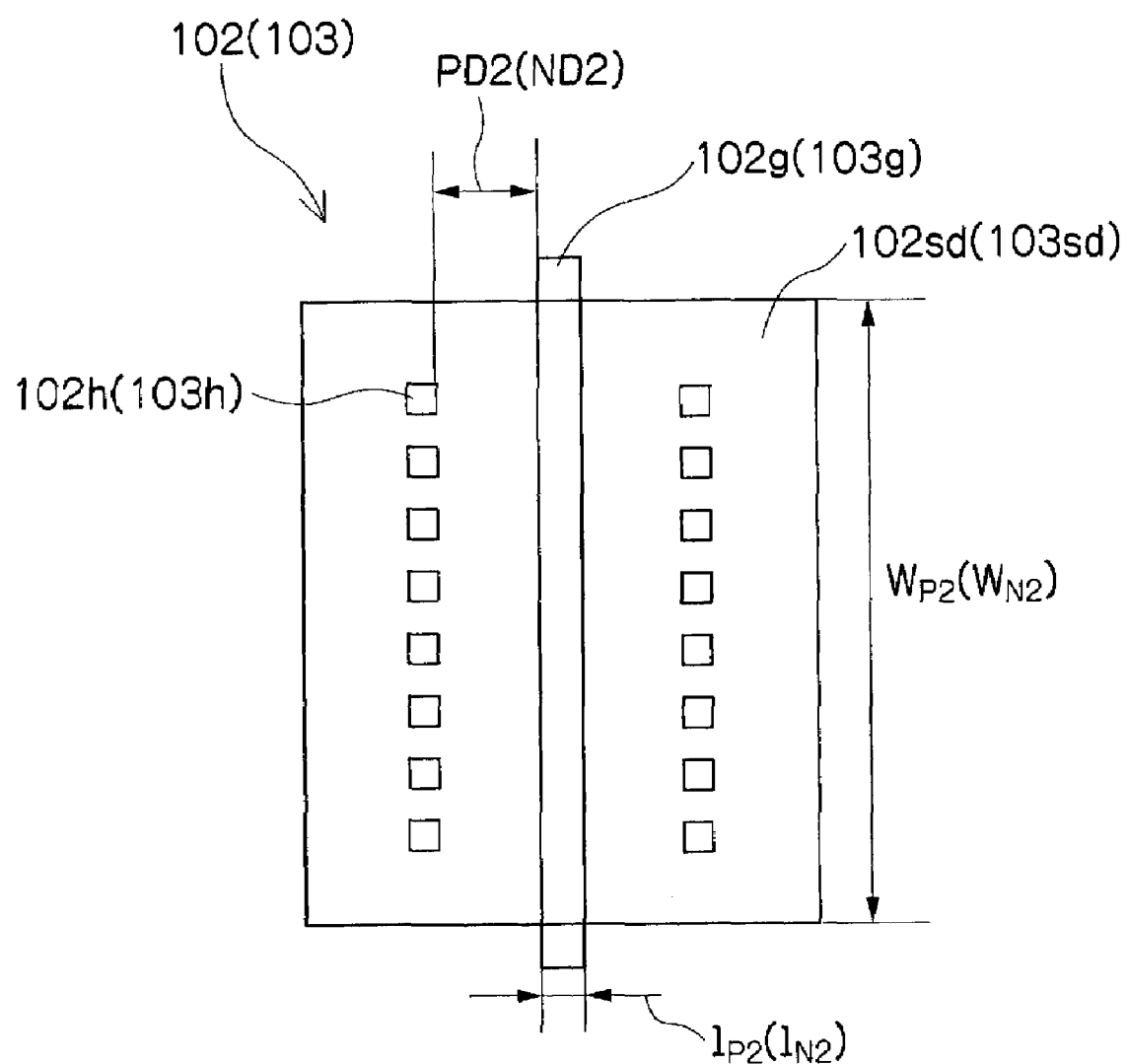
FIG. 3 is a top view showing another protective transistor of the electrostatic-breakdown-preventive and protective circuit for a semiconductor-device of the first embodiment.

FIG. 1 is a circuit diagram showing the electrostatic-breakdown-preventive and protective circuit for a semiconductor-device of the first embodiment. FIG. 2 is a top view showing a protective transistor of the electrostatic-breakdown-preventive and protective circuit for a semiconductor-device of the first embodiment. FIG. 3 is a top view showing another protective transistor of the electrostatic-breakdown-preventive and protective circuit for a semiconductor-device of the first embodiment.

As shown in FIG. 1, the electrostatic-breakdown-preventive and protective circuit for a semiconductor-device of the first embodiment is an input/output-terminal circuit in which a P-channel MOS (Metal Oxide Semiconductor, hereinafter referred to as a PMOS) protective transistor 102 (another protective transistor, hereinafter referred to, not as an output transistor but, as a PMOS protective transistor 102 in order to refer to operations of a protective transistor in this specification) serving as both an output transistor and a protective transistor is connected between an input/output line 101 and an output power-source line 110 (first power-source line), and an N-channel (Metal Oxide Semiconductor, hereinafter referred to as an NMOS) protective transistor 103 (another protective transistor, hereinafter referred to as an NMOS protective transistor 103 in order to refer to operations, not of an output transistor, but of a protective transistor in this specification) serving as both an output transistor and a protective transistor is connected between the input/output line 101 and an output ground line 120 (first ground line), and the input/output line 101 is connected, via a protective resistor 104, to gates of a PMOS transistor 105 and an NMOS transistor 106 of an inverter 130 constituted by the PMOS transistor 105 and the NMOS transistor 106. The source of the PMOS transistor 105 is connected to an internal power-source line 111 (second power-source line) and the source of the NMOS transistor 106 is connected to an internal ground line 121 (second ground line). The drain of the PMOS transistor 105 and that of the NMOS transistor 106 are shorted. In this case, the potential of the output power-source line 110 is equal to that of the internal power-source line 111 and moreover, the potential of the output ground line 120 is equal to that of the internal ground line 121. Moreover, a PMOS protective transistor 107 (first protective transistor) is provided between the output power-source line 110 and the internal power-source line 111 and an NMOS protective transistor 108 (second protective transistor) is provided between the output ground line 120 and the internal ground line 121.

As shown in FIG. 2, for the protective circuit of the first embodiment, it is assumed that the distance from a contact hole (connection port) 107h for connecting an impurity diffusion layer 107sd serving as a source and a drain of the PMOS protective transistor 107 with a metallic wiring up to a gate 107g of the transistor 107 is PD1 and the distance from a contact hole (connection port) 108h for connecting an impurity diffusion layer 108sd serving as a source and a drain of the NMOS protective transistor 108 with a metallic wiring up to a gate 108g of the transistor 108 is ND1. As shown in FIG. 3, it is assumed that the distance from a contact hole (connection port) 102h for connecting an impurity diffusion layer 102sd serving as a source and a drain of the PMOS protective transistor 102 with a metallic wiring up to a gate 102g of the transistor 102 is PD2 and the distance from a contact hole (connection port) 103h for connecting an impurity diffusion layer 103sd serving as a source and a drain of the NMOS protective transistor 103 with a metallic wiring up to a gate 103g of the transistor 103 is ND2. In this case, each transistor is formed so as to satisfy such relations as PD2>PD1 and ND2>ND1.

Particularly to satisfy the above relations, it is preferable to set the distance from the contact hole (connection port) 107h (or 108h) for connecting the impurity diffusion layer 107sd (or 108sd) serving as the source and the drain of each of the PMOS protective transistor 107 and the NMOS protective transistor 108 with a metallic wiring up to the gate 107g (or 108g) to the minimum value in a fabrication process.

In this case, the minimum value in the fabrication process represents the minimum value capable of forming a gate (electrode) and a contact hole separately from each other, which is decided in accordance with dimensional differences (mask conversion differences) between the alignment margin of a gate (electrode)-forming mask and a contact-hole-forming mask, patterns drawn on the masks, and patterns actually transferred onto and actually formed on a silicon wafer. This value depends on a fabrication process and it can be decreased for a process having a smaller (finer) working dimension.

Moreover, for the above protective circuits, it is preferable to form each transistor so as to satisfy such relations as $\{W_{P1}/(1_{P1}+2\times PD1)\} > \{W_{P2}/(1_{P2}+2\times PD2)\}$ and $\{W_{N1}/(1_{N1}+2\times ND1)\} > \{W_{N2}/(1_{N2}+2\times ND2)\}$ when assuming the width of the gate 107g of the PMOS protective transistor 107 is assumed to be $1_{P1}$, the length (length along the gate) of the region of the impurity diffusion layer 107sd serving as a source and the drain is assumed to be $W_{P1}$, the width of the gate 108g of the NMOS transistor 108 is assumed to be $1_{N1}$, and the length (length along the gate) of the region of the impurity diffusion layer 108sd serving as the source and the drain is assumed to be $W_{N1}$, as shown in FIG. 2, and assuming the width of the gate 102g of the PMOS protective transistor 102 is assumed to be $1_{P2}$, the length (length along the gate) of the region of the impurity diffusion layer 102sd serving as a source and the drain is assumed to be $W_{P2}$, and the width of the gate 103g of the NMOS protective transistor 103 as $1_{N2}$, and the length (length along the gate) of the region of the impurity diffusion layer 103sd serving as a source and the drain is assumed to be $W_{N2}$.

Here, the above expression $\{W_{P1}/(1_{P1}+2\times PD1)\}$ shows the flowability of an electrostatic surge supplied by the PMOS protective transistor 107. The above expression $\{W_{P2}/(1_{P2}+2\times PD2)\}$ shows the flowability of an electrostatic surge of the PMOS protective transistor 102, $\{W_{N1}/(1_{N1}+2\times ND1)\}$ shows the flowability of an electrostatic surge of the NMOS protective transistor 108, and $\{W_{N2}/(1_{N2}+2\times ND2)\}$ shows the flowability of an electrostatic surge of the NMOS protective transistor 103. The reason is described below by assuming $\{W_{P1}/(1_{P1}+2\times PD1)\}$ to be $r_{107}$, $\{W_{P2}/(1_{P2}+2\times PD2)\}$ to be $r_{102}$, $\{W_{N1}/(1_{N1}+2\times ND1)\}$ to be $r_{108}$, and $\{W_{N2}/(1_{N2}+2\times PD2)\}$ to be $r_{103}$.

Figure 4:
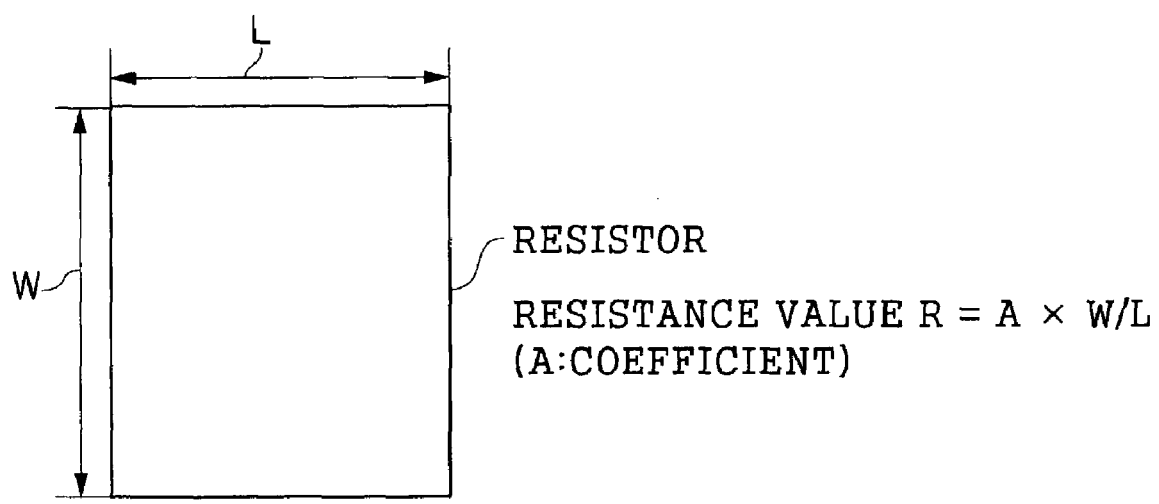
FIG. 4 is a schematic view for explaining the relation between resistance width W and resistance length L at a resistance value R of a resistor.

As shown in FIG. 4, the resistance value R of a resistor is shown by the expression R=A×(W/L) (A is a coefficient) and it is proportional to a resistance width W and inversely proportional to a resistance length L. When the PMOS protective transistors 107 and 102 and NMOS protective transistors 108 and 103 respectively supply an electrostatic surge, these transistors serve as resistances. When handling a protective transistor as a resistance, $W_{P1}$, $W_{P2}$, $W_{N1}$, and $W_{N2}$ in FIGS. 2 and 3 respectively correspond to the resistance width W and $\{1_{P1}+2\times PD1\}$, $\{1_{P2}+2\times PD2\}$, $\{1_{N1}+2\times ND1\}$, and $\{1_{N2}+2\times ND2\}$ in FIGS. 2 and 3 respectively correspond to the resistance length L. Therefore, it is possible to show the flowability of the electrostatic surge of the PMOS protective transistor 107 as $r_{107}=\{W_{P1}/(1_{P1}+2\times PD1)\}$, and hereinafter similarly $r_{102}=\{W_{P2}/(1_{P2}+2\times PD2)\}$, $r_{108}=\{W_{N1}/(1_{N1}+2\times ND1)\}$, and $r_{103}=\{W_{N2}/(1_{N2}+2\times ND2)\}$.

Next, the flowability of an electrostatic surge when replacing a protective transistor with a resistor, that is, the relation between response characteristic to electrostatic surge and resistance value is described below.

Figure 5:
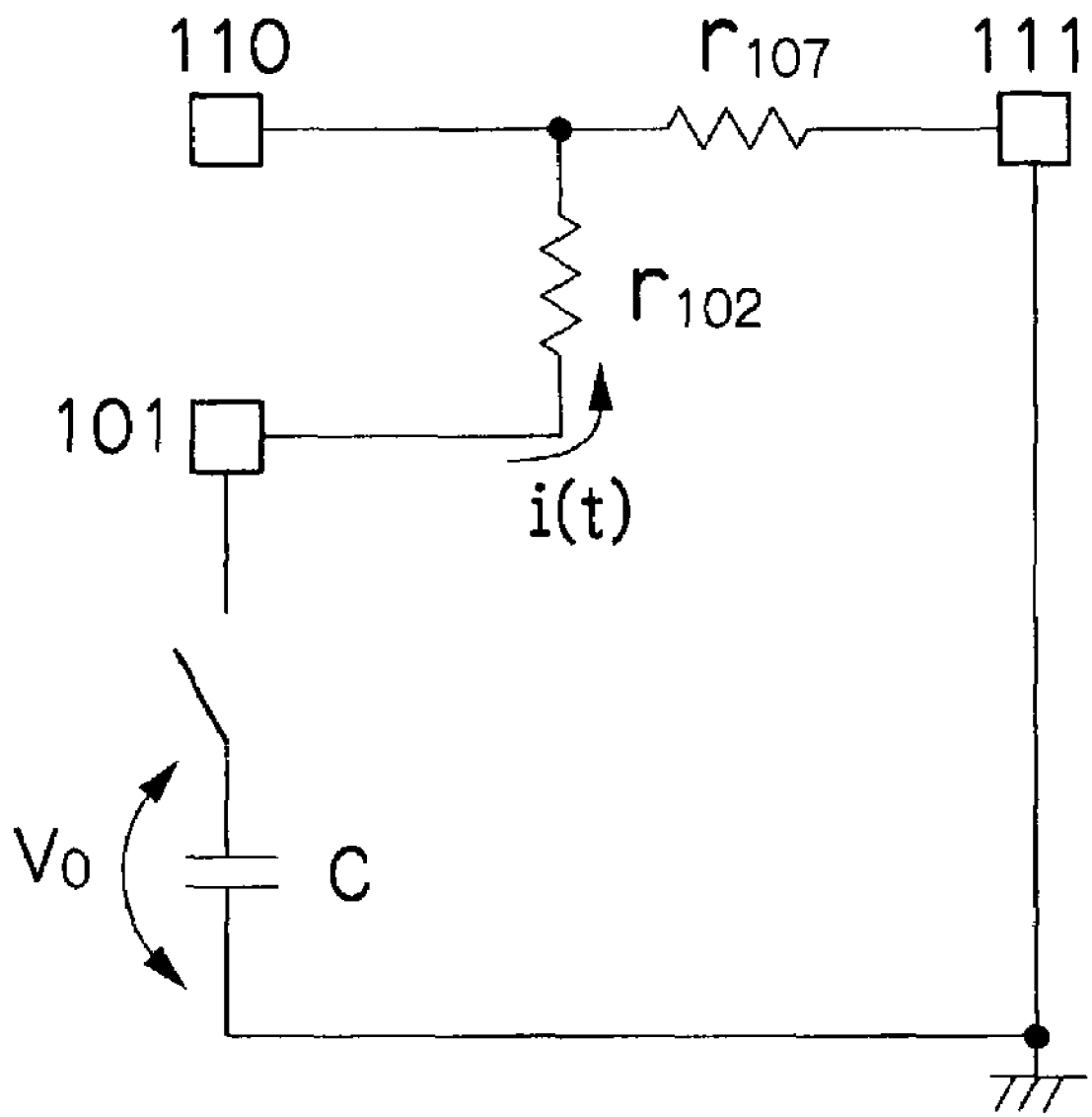
FIG. 5 is a circuit diagram showing a circuit diagram of an equivalent circuit obtained by replacing a PMOS protective transistor with a resistor and using an electrostatic surge as discharge from a discharged capacitor in the electrostatic-breakdown-preventive and protective circuit shown in FIG. 1.

FIG. 5 shows an equivalent circuit obtained by replacing the PMOS protective transistors 107 and 102 with the resistors $r_{107}$ and $r_{102}$ and using the capacitance C of a capacitor whose electrostatic surge is charged to a voltage $V_0$ in the electrostatic-breakdown-preventive and protective circuit shown in FIG. 1. A current value flowing through a circuit after closing a switch is shown by the following expression (1) as a function of time.

$$i(t) = \frac{V_0}{r_{107} + r_{102}} \exp\left[-\frac{t}{r_{107} + r_{102} \times C}\right] \quad (1)$$

The above expression (1) will be considered for two cases when it is assumed that (a) $r_{107}$ is equal to $r_{102}$ and when (b) $r_{107}$ is smaller enough than $r_{102}$.

In the case of (a), when assuming $r_{107}=r_{102}$, the expression (1) can be shown as the following expression (1, a).

$$i_1(t) = \frac{V_0}{2R} \exp\left[-\frac{t}{2RC}\right] \quad (1, a)$$

In the case of (b), because of $r_{107} \ll r_{102}$, an approximation $r_{107}+r_{102}=R$ can be made. Therefore, the expression (1) is shown as the following expression (1, b).

$$i_2(t) = \frac{V_0}{R} \exp\left[-\frac{t}{RC}\right] \quad (1, b)$$

Figure 6:
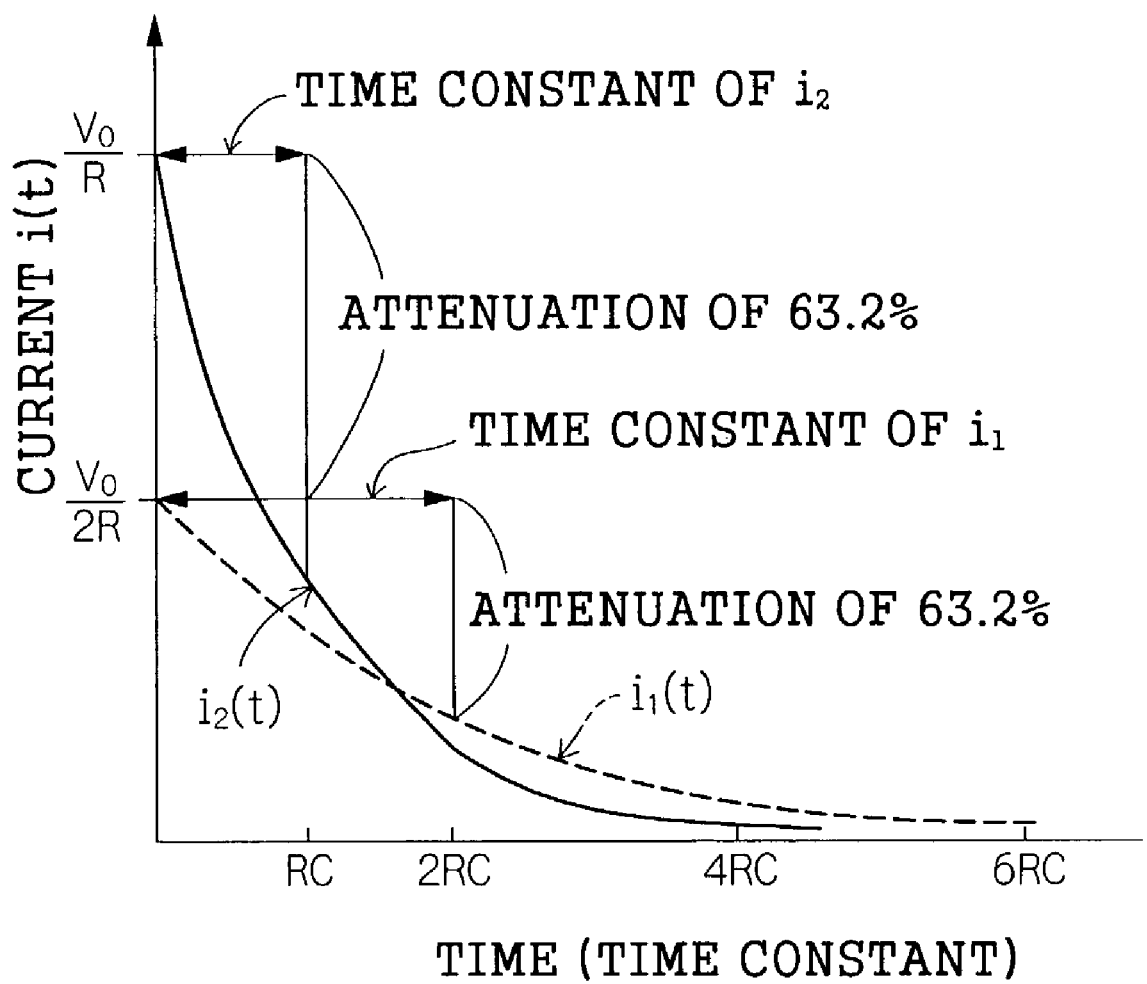
FIG. 6 is a graph showing the relation between current passing through the equivalent circuit shown in FIG. 5 and time.

FIG. 6 is obtained by assigning time to an abscissa and thereby graphing a current $i_1(t)$ circulating through a circuit in the case of (a) and a current $i_2$ circulating through a circuit in the case of (b).

As shown in FIG. 6, though the current $i_2$ is two times larger than the current $i_1$ in initial current value, the subsequent attenuation time is short. This represents that the time in which a surge current circulates through a circuit is decreased, that is, the response characteristic to a surge is improved by decreasing $r_{107}$. Because decrease of the distance between a gate and a contact hole corresponds to decrease of (2×PD1) and (2×ND1), $r_{107}$ and $r_{108}$ are decreased.

The fact that the initial current of $i_2$ flows two times larger than that of $i_1$ represents being exposed to a sudden surge current and therefore, a protective transistor is easily broken down. However, by properly increasing a resistance, it is possible to reduce an initial value and prevent a protective transistor from being easily broken down (however, response characteristic is deteriorated).

Thus, a proper resistance is provided for the PMOS protective transistor 102 and NMOS protective transistor 103 respectively requiring resistance characteristics and resistances of the PMOS protective transistor 107 and NMOS protective transistor 108 having priority to the response characteristic to a surge are minimized.

The mathematical equation that expresses the above-described relationship is $(W_{P1}/1_{P1}+2\times PD1)>(W_{P2}/1_{P2}+2\times PD2)$ and $(W_{N1}/1_{N1}+2\times ND1)>(W_{N2}/1_{N2}+2\times ND2)$.

As described above, the response characteristic of a protective transistor is improved when the distance between a gate and a contact hole is small. However, a transistor is easily broken by a surge current suddenly flowing. However, when the distance between a gate and a contact hole is increased, the response characteristic to an electrostatic surge is deteriorated though a surge current can be properly restricted. Particularly, when setting the above distance to the minimum value in a fabrication process, the response characteristic is maximally shown.

Therefore, for the protective circuit of the first embodiment, the distance from the contact hole (connection port) 107*h* (or 108*h*) of the PMOS protective transistor 107 or NMOS protective transistor 108 up to the gate 107*g* (or 108*g*) of the same is made shorter than the distance from the contact hole (connection port) 102*h* (or 103*h*) of the PMOS protective transistor 102 or NMOS protective transistor 103 up to the gate 102*g* (or 103*g*) of the same. That is, for each of the PMOS protective transistor 102 and the NMOS protective transistor 103, both of which must use a transistor having a low response characteristic, the distance between a gate and a contact hole is increased in order to secure its breakdown resistance. For each of the PMOS protective transistor 107 and NMOS protective transistor 108, the distance between a gate and a contact hole is decreased in order to improve the response characteristic (particularly, it is preferable to make each of the transistors 107 and 108 maximally show the response characteristic by setting the distance to the minimum value in a process). When an electrostatic surge is applied between the input/output line 101 and the internal power-source line 111, the response characteristic of a path for supplying a surge current to the inverter 130 is improved, a surge voltage applied to the protective resistor 104 for preventing the surge voltage from being applied to the gate of each transistor of the inverter 130 is lowered by the time the electrostatic surge is completely flown, and the gate breakdown of the PMOS transistor 105 of the inverter 130 is prevented while keeping the breakdown resistance of a protective transistor by improving the breakdown resistance of the PMOS protective transistor 102 and the response characteristic of the PMOS protective transistor 107. Also when an electrostatic surge is applied between the input/output line 101 and the internal ground line 121, the gate breakdown of the NMOS transistor 106 of the inverter 130 is prevented by improving the breakdown resistance of the NMOS protective transistor 103 and the response characteristic of the NMOS protective transistor 108.

As described above, for the PMOS protective transistor 107 and NMOS protective transistor 108, breakdown of the gate of each transistor of the inverter 130 is prevented while preventing the resistance value of the protective resistor 104 from increasing by decreasing the distance from a contact hole (connection port) up to a gate compared to the case of the PMOS protective transistor 102 and NMOS protective transistor 103, improving the response characteristic, and particularly setting the distance to the minimum value in a fabrication process and thereby maximally showing the response characteristic. Moreover, by decreasing the distance between the gates of the PMOS protective transistor 107 and the NMOS protective transistor 108 to a contact hole (particularly using the minimum value in a fabrication process), it is possible to decrease the area of a protective transistor.

Even if the PMOS protective transistor 107 and NMOS protective transistor 108 are broken down, they do not become electrically defective because potentials of the output power-source line 110 and the internal power-source line 111 are equal to each other and those of the output ground line 120 and internal ground line 121 are equal to each other. If there is an influence, it is thought that the malfunction margin of an internal circuit due to switching noises of an output transistor will be decreased. However, the influence is slight compared to the case in which they become electrically defective due to electrostatic breakdown.

SECOND EMBODIMENT

Figure 7:
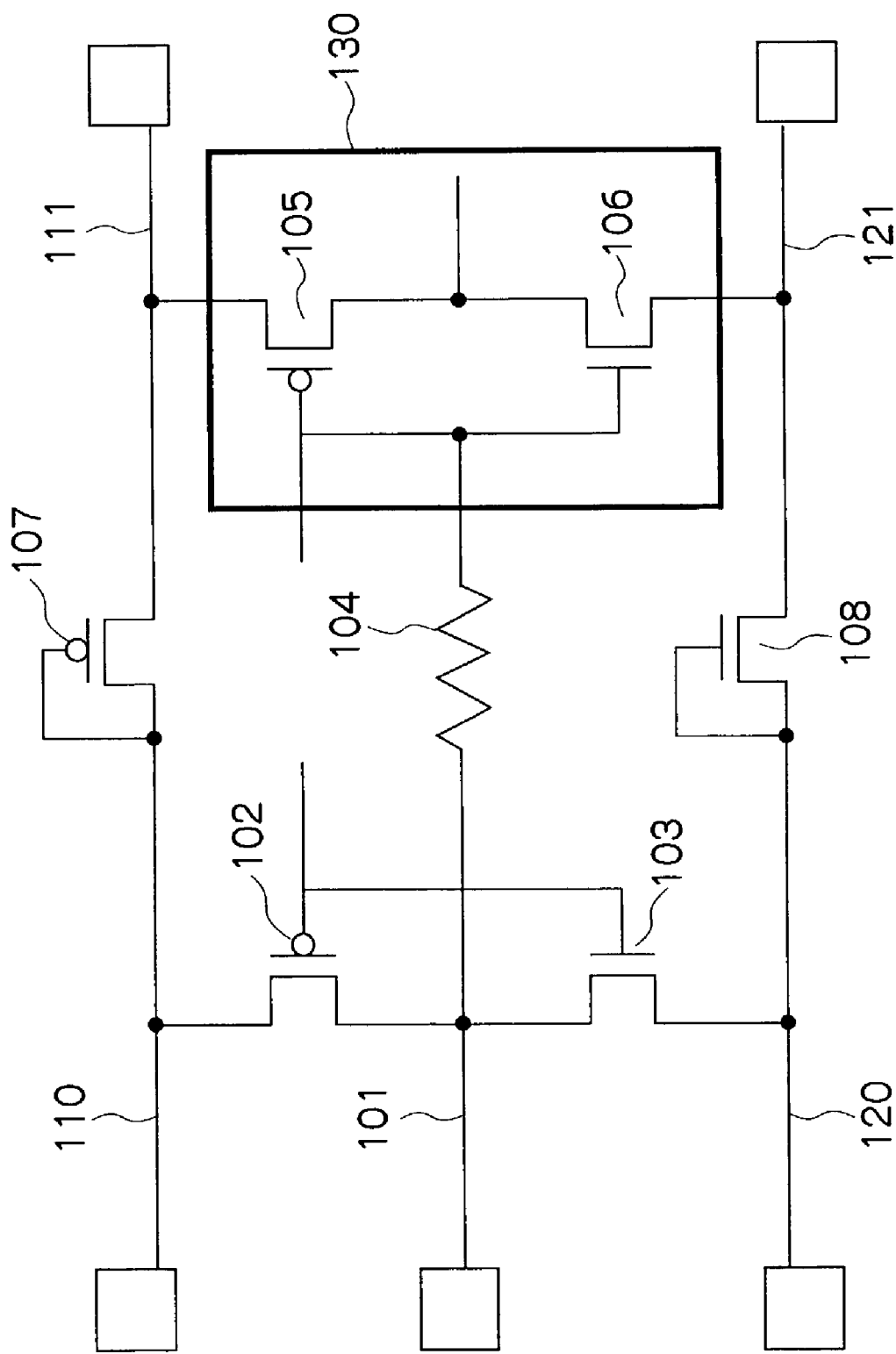
FIG. 7 is a circuit diagram showing an electrostatic-breakdown-preventive and protective circuit for a semiconductor-device of a second embodiment of the present invention.
Figure 8:
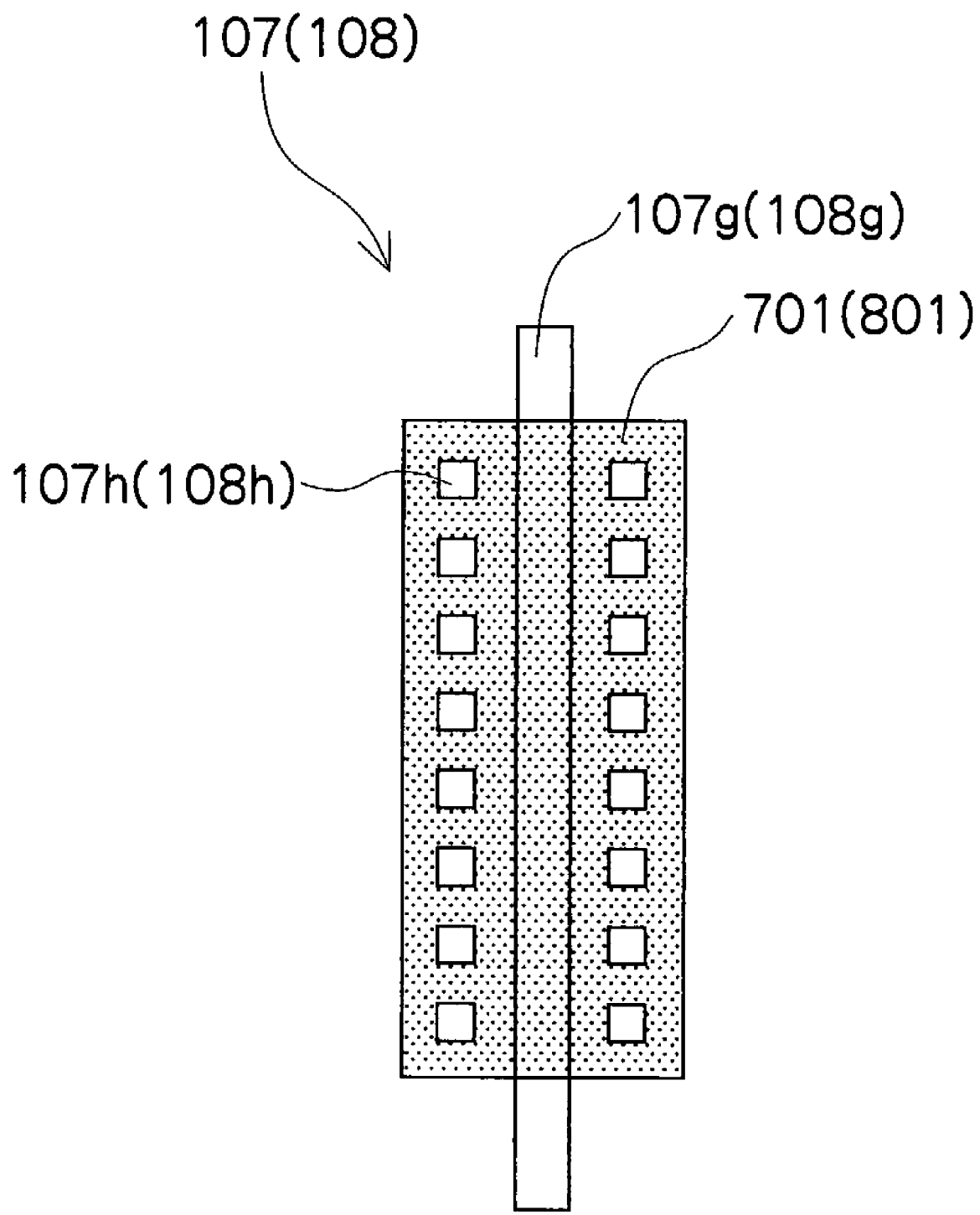
FIG. 8 is a top view showing a protective transistor of the electrostatic-breakdown-preventive and protective circuit for a semiconductor-device of the second embodiment.
Figure 9:
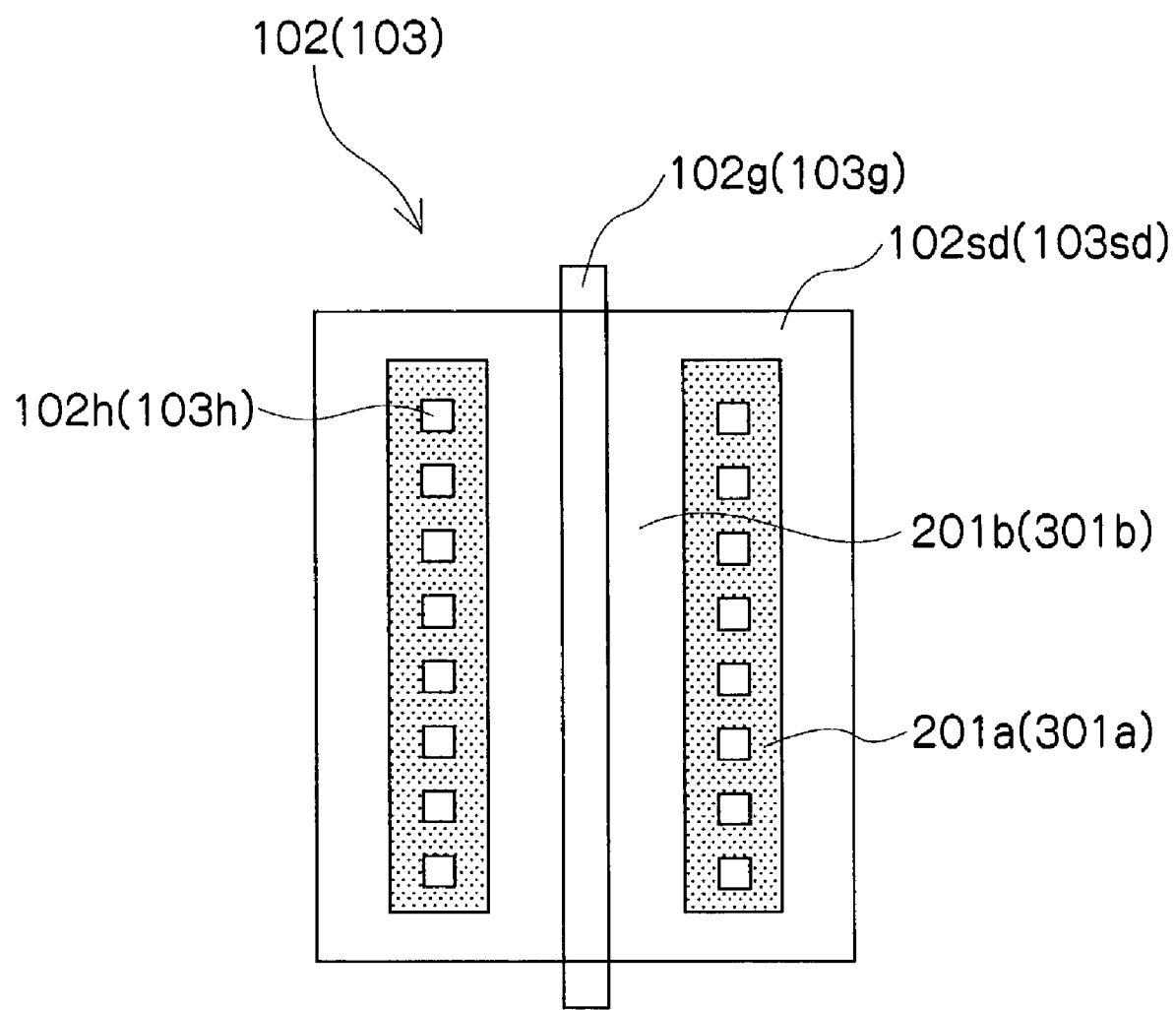
FIG. 9 is a top view showing another protective transistor of the electrostatic-breakdown-preventive and protective circuit for a semiconductor-device of the second embodiment.

FIG. 7 is a circuit diagram showing an electrostatic-breakdown-preventive and protective circuit for a semiconductor-device of a second embodiment. FIG. 8 is a top view showing a protective transistor in the electrostatic-breakdown-preventive and protective circuit for a semiconductor-device of the second embodiment. FIG. 9 is a top view showing another protective transistor in the electrostatic-breakdown-preventive and protective circuit for a semiconductor-device of the second embodiment.

In the case of the electrostatic-breakdown-preventive and protective circuit for a semiconductor-device of the second embodiment, description of portions common to those of the first embodiment is omitted. The second embodiment uses a transistor adopting the so-called salicide structure in which a compound layer of silicon and metal (hereinafter referred to as a salicide layer) is formed on the surface of an impurity diffusion layer in order to decrease the parasitic resistance of the impurity diffusion layer.

In a protective circuit of the second embodiment, a salicide layer 701 is formed on the entire surface between a gate 107g and a contact hole 107h on an impurity diffusion layer 107sd (impurity diffusion layer 107sd is not illustrated in FIG. 8) serving as the source and the drain for the PMOS protective transistor 107 shown in FIG. 8, a salicide layer 201a is formed in the vicinity of a contact hole 102h of an impurity diffusion layer 102sd serving as the source and the drain and a non-salicide-layer-forming region 201b in which a salicide layer 201a is not formed (that is, remaining as a P-type impurity diffusion layer) is formed between a gate 102g and a contact hole 102h and in a PMOS protective transistor 102 shown in FIG. 9. Similarly, a salicide layer 801 is formed on the entire surface between a gate 108g and a contact hole 108h on an impurity diffusion layer 108sd (impurity diffusion layer 108sd is not illustrated in FIG. 8) serving as the source and the drain of the NMOS protective transistor 108 in the NMOS protective transistor 108 shown in FIG. 8, a salicide layer 301a is formed in the vicinity of a contact hole 103h on an impurity diffusion layer 103sd serving as the source and the drain and a non-salicide-layer-forming region 301b in which the salicide layer 301a is not formed (that is, remaining as an N-type impurity diffusion layer) is formed between a gate 103g and a contact hole 103h in the NMOS protective transistor 103 shown in FIG. 9.

In general, when a salicide layer is formed on the entire surface between a gate and a contact hole on an impurity diffusion layer serving as a source and a drain, the response characteristic is improved even though a transistor becomes likely to be broken down if a surge current suddenly flows. However, when a region remaining as an impurity diffusion layer if formed (a region where no salicide layer is formed) between a gate and contact hole, the electrostatic-breakdown resistance of a transistor is improved because a surge current can be properly restricted, but the response characteristic to an electrostatic surge is deteriorated.

Therefore, in the protective circuit of the second embodiment, the PMOS protective transistor 102 and the NMOS protective transistor 103, each of which must use a transistor having a low response characteristic, respectively provide a region (non-salicide-layer-forming region) remaining as an impurity diffusion layer between the gate and the contact hole in order to secure their own breakdown resistance, and the PMOS protective transistor 107 and NMOS protective transistor 108 respectively form a salicide layer on the entire surface between the gate and the contact hole on the impurity diffusion layer serving as the source and the drain in order to improve the response characteristic. When an electrostatic surge is applied between the input/output line 101 and the internal power-source line 111, as the case of the first embodiment, the gate breakdown of the PMOS transistor 105 of the inverter 130 is prevented by improving the breakdown resistance of the PMOS protective transistor 102 and the response characteristic of the PMOS protective transistor 107. Moreover, also when an electrostatic surge is applied between the input/output line 101 and the internal ground line 121, gate breakdown of the NMOS transistor 106 of the inverter 130 is prevented by improving the breakdown resistance of the NMOS protective transistor 103 and the response characteristic of the NMOS protective transistor 108.

As described above, in the case of the PMOS protective transistor 107 and the NMOS protective transistor 108, a salicide layer is formed on the entire surface between a gate and the contact hole to improve the response characteristic of the protective transistor to an electrostatic surge and in the case of the PMOS protective transistor 102 and the NMOS protective transistor 103, a region (non-salicide-layer-forming region) remaining as the impurity diffusion layer is provided between the gate and the contact hole to improve the breakdown resistance against an electrostatic surge. Therefore, it is possible to prevent gate breakdown of each transistor of the inverter 130 while suppressing the resistance value of the protective transistor 104 from increasing. Moreover, in the case of the PMOS protective transistor 107 and NMOS protective transistor 108, it is possible to decrease the protective-transistor area because a region, which leaves an impurity diffusion layer as it is, is not intentionally formed between the gate and the contact hole.

Even if the PMOS protective transistor 107 and the NMOS protective transistor 108 are broken down, it is the same as the case of the first embodiment in that the influence is slight.

THIRD EMBODIMENT

Figure 10:
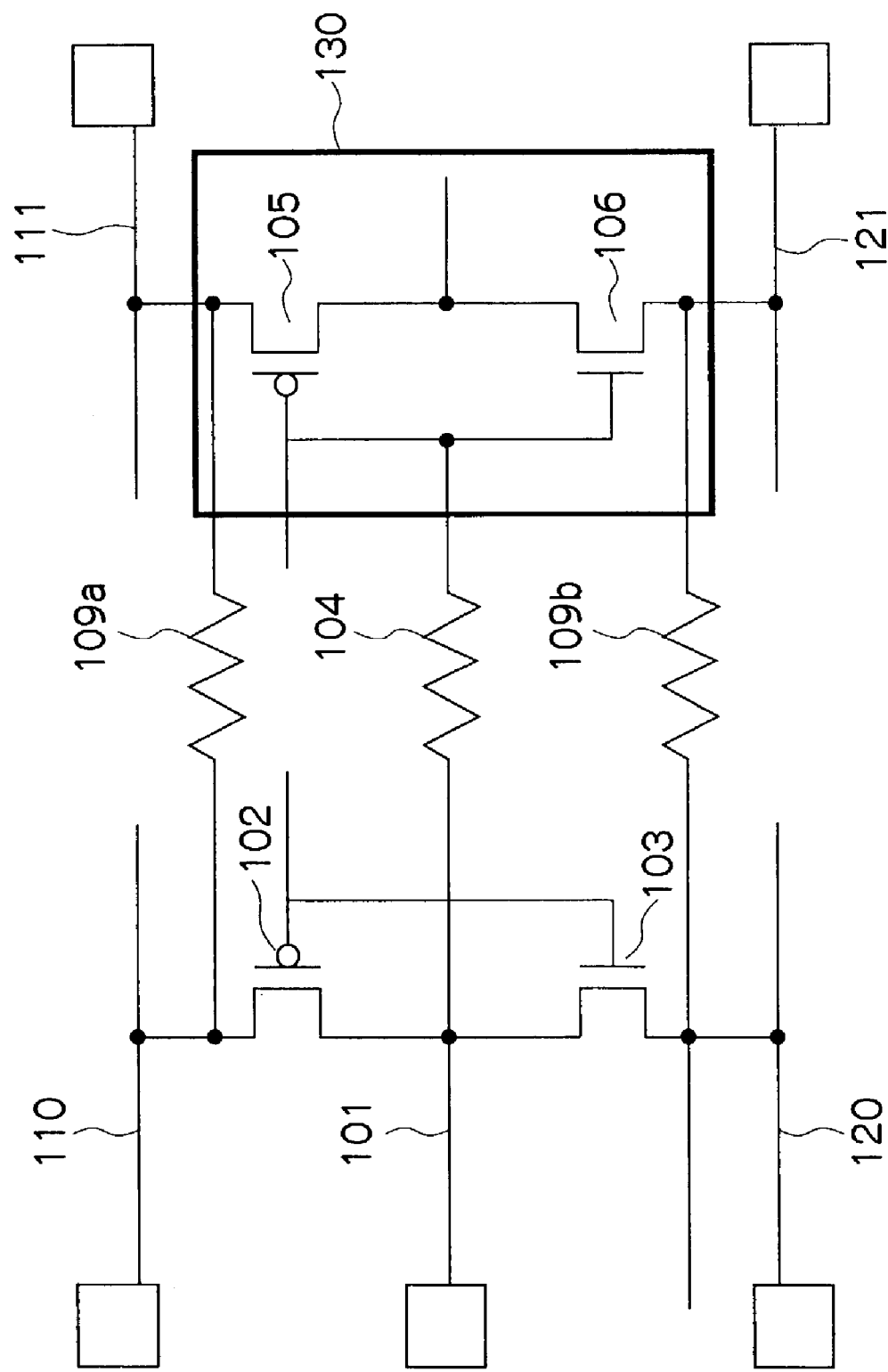
FIG. 10 is a circuit diagram showing the electrostatic-breakdown-preventive and protective circuit for a semiconductor-device of the third embodiment.
Figure 11:
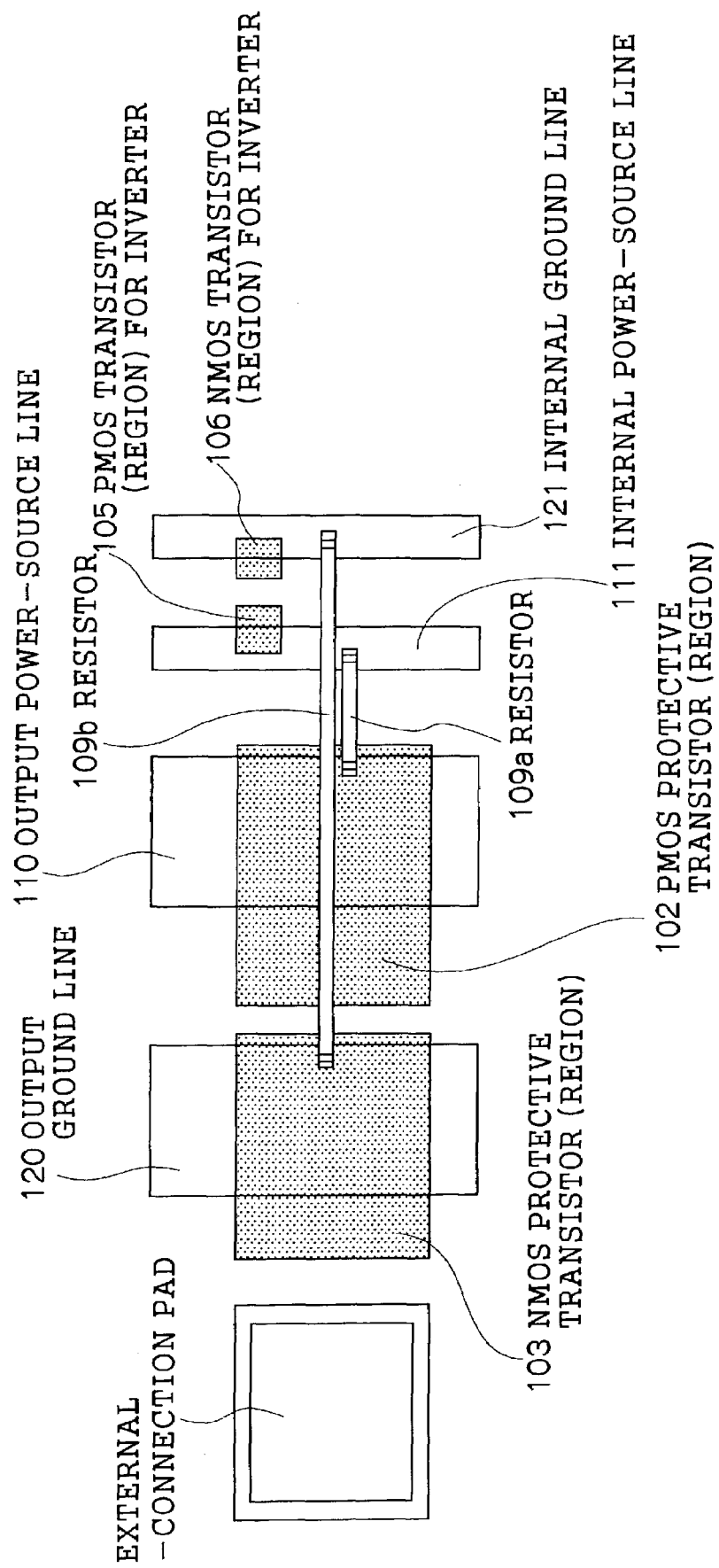
FIG. 11 is a layout image diagram of an electrostatic-breakdown-preventive and protective circuit for a semiconductor-device of a third embodiment of the present invention.
Figure 12:
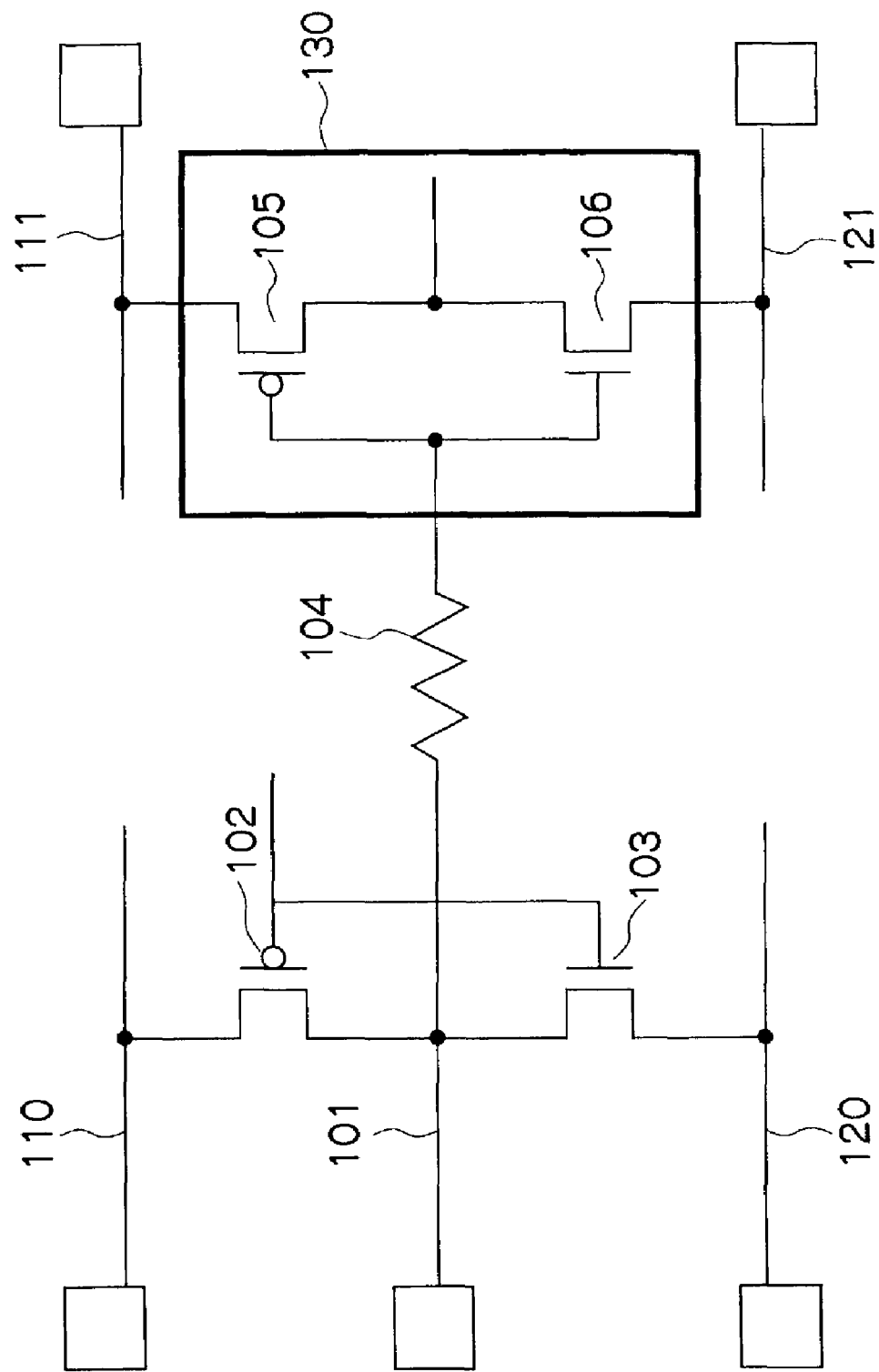
FIG. 12 shows a conventional semiconductor-device electrostatic-breakdown-preventive and protective circuit (circuit diagram of an input/output terminal).
Figure 13:
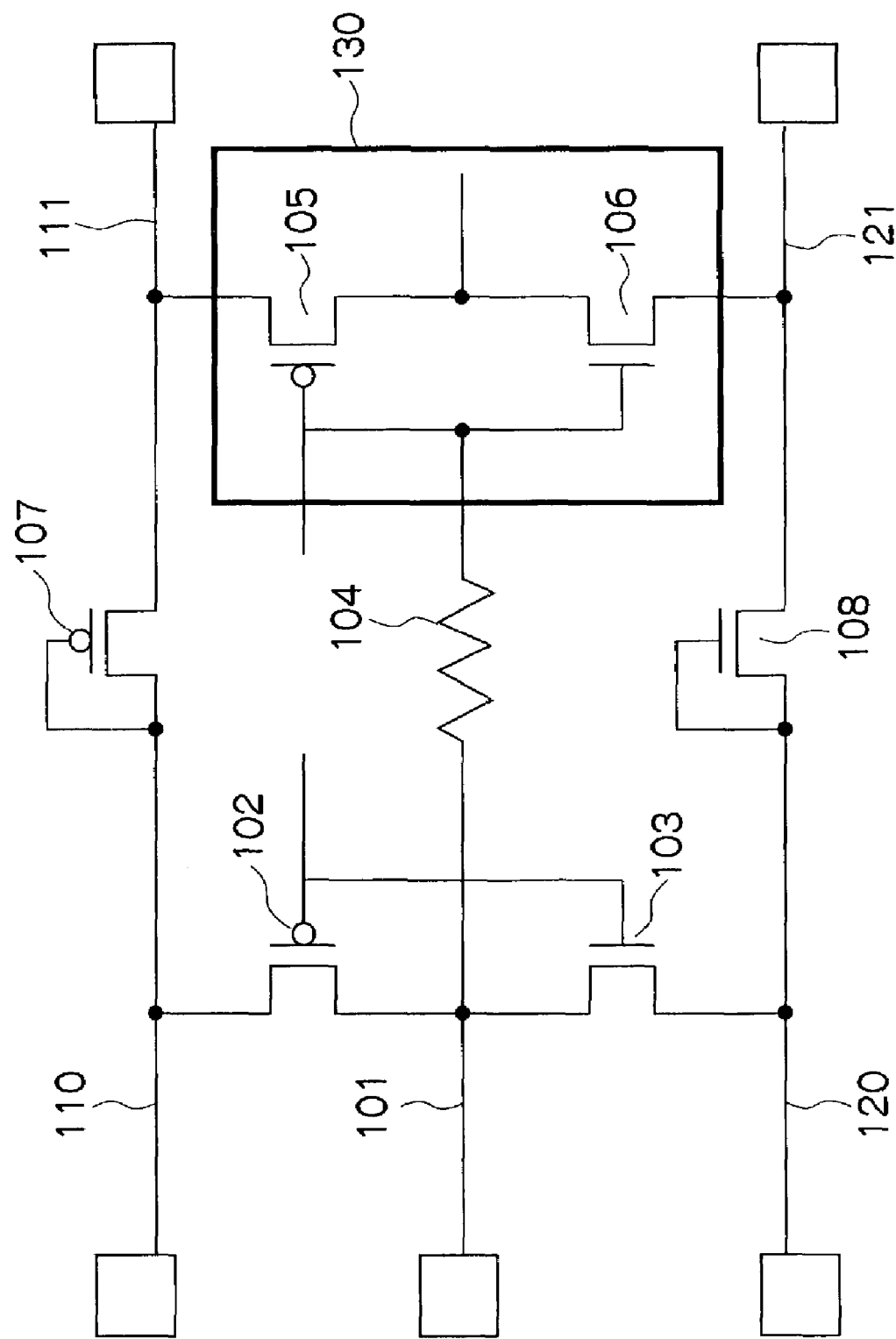
FIG. 13 shows a conventional improved semiconductor-device electrostatic-breakdown-preventive and protective circuit (circuit diagram of an input/output terminal).

FIG. 10 is a circuit diagram showing an electrostatic-breakdown-preventive and protective circuit for a semiconductor-device of third embodiment. FIG. 11 is a layout image diagram of the electrostatic-breakdown-preventive and protective circuit for a semiconductor-device of the third embodiment.

For the electrostatic-breakdown-preventive and protective circuit for a semiconductor-device of the third embodiment, description of a portion common to that of the first embodiment is omitted. As shown in FIGS. 10 and 11, in the electrostatic-breakdown-preventive and protective circuit for a semiconductor-device of the third embodiment, the PMOS protective transistor 107 or the NMOS protective transistor 108 of the first embodiment is not used but the vicinity of the connective portion between the source of a PMOS protective transistor 102 and an output power-source line 110 and the vicinity of the connective portion between the source of the PMOS transistor 105 and the internal power-source line 111 of the inverter are shorted through a resistor 109a and the vicinity of the connective portion between the source of the NMOS protective transistor 103 and the output ground line 120 of the inverter 130 and the vicinity of the source of the NMOS transistor 106 and the internal ground line 121 of the inverter 130 are shorted through a resistor 109b. In FIG. 11, however, detailed connections between the input/output line 101, protective resistor 104, and various portions are omitted.

In the protective circuit of the third embodiment, when an electrostatic surge is applied between the input/output line 101 and internal power-source line 111, a surge current flows through the PMOS protective transistor 102 and the newly-set resistor 109a. By replacing the PMOS protective transistor 107 of the first or the second embodiment with the resistor 109a, a time delay until the PMOS protective transistor 107 can supply a surge current is eliminated. Moreover, when the PMOS protective transistor 107 supplies a surge current, it is necessary that (1) the protective transistor causes a punch-through or (2) a gate is inverted to form a channel. In any case, it is indispensable that an below-gate (channel region) is depleted due to an electric field supplied from the drain or the gate. However, because the depletion requires even a short time, the response characteristic to a surge current is further improved by forming a bypass with a pure resistor. Therefore, a surge voltage applied to the protective resistor 104 for preventing the surge voltage from being applied to the gate of each transistor of the inverter 130 is further lowered and it is possible to more-efficiently prevent the gate breakdown of the PMOS transistor 105 of the inverter 130. Similarly, when an electrostatic surge is applied between the input/output line 101 and the internal ground line 121, a surge current flows through the NMOS protective transistor 103 and the newly-set resistor 109b. Therefore, it is possible to prevent the gate breakdown of the NMOS transistor 106 of the inverter 130.

As described above, by replacing the PMOS protective transistor 107 and the NMOS transistor 108 of the first or the second embodiments with the resistor 109a and the resistor 109b, respectively, it is possible to prevent the gate breakdown of each transistor of the inverter 130 while suppressing the resistance value of the protective resistor 104 from increasing. Moreover, it is possible to greatly decrease a pattern area because it is only necessary to short the output power-source line 110 and the internal power-source line 111 and the output ground line 120 and the internal ground line 121 through a resistor.

Also in the third embodiment, a malfunction margin may be decreased due to switching noises of a protective transistor. However, the influence is slight compared to the case in which the protective transistor becomes electrically defective due to electrostatic breakdown. Moreover, for the resistors 109a and 109b, it is possible to select an optimum resistance value capable of minimizing influences due to switching noises while securing the electrostatic-breakdown resistance characteristics.

The above first to third embodiments are described by using a CMOS input/output terminal as an example. The embodiments can be also applied to the so-called open-drain-type input/output terminal having only one of a PMOS or a NMOS transistor. Moreover, they can be applied to a CMOS input terminal or open-drain-type input terminal having no output circuit. Furthermore, it is possible to combine the first to third embodiments. Furthermore, it is allowed to apply the first to third embodiments to only the power-source line side or ground-line side.

What is claimed is:

1. An electrostatic-breakdown-preventive and protective circuit for a semiconductor-device, the circuit comprising:
a first protective transistor disposed between a first power-source line and a second power-source line, the first power-source line is connected to one of a first output transistor and a first protection transistor disposed at an input terminal, and the second power-source line is connected to an inverter of an internal circuit; and
a second protective transistor disposed between a first ground line and a second ground line, the first ground line is connected to one of a second output transistor and a second protection transistor disposed at the input terminal, and the second ground line is connected to the inverter of the internal circuit,
wherein a distance from first contact holes for connecting first impurity diffusion layers which serve as sources and as drains of each of the first and second protective transistors with metallic wiring, to gates of the first and second protective transistors, is smaller than a distance from second contact holes for connecting second impurity diffusion layers which serve as sources and as drains of the respective ones of the first and second output transistors and the first and second protection transistors disposed at the input terminal with metallic wiring, to gates of the first and second output transistors and the first and second protection transistors.

2. The electrostatic-breakdown-preventive and protective circuit for a semiconductor-device of claim 1, wherein a compound layer of silicon and metal is on entire respective surfaces between the contact holes and the gates in the first and the second protective transistors, and
regions without the compound layer of silicon and metal are disposed between the contact holes and the gates in the first and second output transistors and the first and second protection transistors disposed at the input terminal.

3. The electrostatic-breakdown-preventive and protective circuit for a semiconductor-device of claim 1, further comprising:
at least one of a first resistor having one end connected to the first power-source line in a vicinity of the first output transistor or the first protection transistor disposed for the input terminal and having another end connected to the second power-source line in a vicinity of the inverter of the internal circuit, and a second resistor having one end connected to the first ground line in a vicinity of the second output transistor or the second protection transistor disposed for the input terminal and having another end connected to the second ground line in a vicinity of the inverter of the internal circuit.

4. The electrostatic-breakdown-preventive and protective circuit for a semiconductor-device of claim 1, wherein the distance from the first contact holes of each of the first and second protective transistors is a minimum value in a fabrication process.

* * * * *